United States Patent [19]
Okamoto

[11] Patent Number: 5,303,174
[45] Date of Patent: Apr. 12, 1994

[54] FLOATING POINTING ARITHMETIC OPERATION SYSTEM

[75] Inventor: Fuyuki Okamoto, Tokyo, Japan

[73] Assignee: NEC Corporation, Tokyo, Japan

[21] Appl. No.: 957,948

[22] Filed: Oct. 7, 1992

[30] Foreign Application Priority Data

Oct. 7, 1991 [JP] Japan .................................. 3-258990

[51] Int. Cl.$^5$ .............................................. G06F 7/38
[52] U.S. Cl. ................................ 364/748; 364/715.03
[58] Field of Search ............................. 364/748, 715.03

[56] References Cited

U.S. PATENT DOCUMENTS

| | | | |
|---|---|---|---|
| 4,511,990 | 4/1985 | Hagiwara et al. | 364/748 |
| 4,631,696 | 12/1986 | Sakamoto | 364/748 |
| 4,758,974 | 7/1988 | Fields et al. | 364/748 |
| 5,027,308 | 6/1991 | Sit et al. | 364/748 |
| 5,063,530 | 11/1991 | Ishikawa | 364/748 |
| 5,146,419 | 9/1992 | Miyoshi et al. | 364/748 |

Primary Examiner—Long T. Nguyen
Attorney, Agent, or Firm—Whitham & Marhoefer

[57] ABSTRACT

In a floating point arithmetic addition/subtraction system which is configured to receive a pair of input operands of floating point data including its mantissa part expressed in an absolute value so as to execute an addition/subtraction and which includes a mantissa adder, a normalizing shifter, an exponent part updater and a bit position decoder, integer data expressed in a 2's complement is supplied as one of the pair of input operands, and the integer data is converted into an absolute value by using the mantissa adder. Thereafter, the bit position of the obtained absolute value is modified by using the normalizing shifter so as to give a mantissa part, and a value of an exponent part is generated by using the updater and the bit position decoder.

3 Claims, 6 Drawing Sheets

$$\text{VALUE} = (-1)^S \times 2^{e-16384} \times m$$

$$\text{VALUE} = -2^{31} \cdot S + V$$

SIGN EXPANSION OF INTEGER DATA

CONVERSION INTO ABSOLUTE VALUE BY USING MANTISSA ADDER

DETECTION OF POSITION OF MSB "1" BIT

LEFT SHIFTING AND CALCULATION OF EXPONENT PART

FIGURE 4

$2^5 \times 1.101011$ $-) \; 2^5 \times 1.101000$ $2^5 \times 0.000011$

↓ 5-BIT LEFT SHIFTING FOR NORMALIZATION $2^0 \times 1.100000$

FIGURE 5

$2^5 \times 1.001011$ $-) \; 2^4 \times 1.110000$

↓ 1-BIT RIGHT SHIFTING FOR EXPONENT PART MATCHING $2^5 \times 1.001011$ $-) \; 2^5 \times 0.111000$ $2^5 \times 0.010011$

↓ 2-BIT LEFT SHIFTING FOR NORMALIZATION $2^3 \times 1.001100$

FLOATING POINTING ARITHMETIC OPERATION SYSTEM

BACKGROUND OF THE INVENTION

1. Field of the invention

The present invention relates to a floating point arithmetic operation system. More specifically, the present invention relates to a floating point arithmetic operation system having a function of executing a data converting instruction for converting integer data into floating point data. Furthermore, the present invention relates to a floating point arithmetic operation system capable of executing an arithmetic operation with a reduced number of barrel shiftings. Still more, the present invention relates to a floating point arithmetic operation system capable of executing a fixed point arithmetic operation with an improved throughput.

2. Description of related art

In general, computer systems are configured to handle not only floating point data but also integer data. Therefore, in some cases it is necessary to execute a data converting instruction for converting the integer data into the floating point data.

In conventional computer systems, a floating point arithmetic operation unit has been used exclusively for the floating point arithmetic operation. On the other hand, no hardware for the data conversion has been incorporated in the computer system in order to suppress the overhead in the number of circuit elements, and therefore, the data conversion instruction has been executed by controlling an arithmetic operation unit for integer and shifters by microprograms. Therefore, execution of the data conversion instruction could not have been fastened.

On the other hand, the conventional floating point arithmetic addition/subtraction system can be broadly said to execute four steps, namely, (1) a large-and-small comparison and exponent subtraction, (2) a right barrel shifting of a mantissa part for matching of exponent parts, (3) a mantissa addition/subtraction, and (4) a normalizing barrel shifting of the result of arithmetic operation. In addition, this floating point arithmetic addition/subtraction system can be used for executing a fixed point arithmetic addition/subtraction, by controlling the system in such a manner that the fixed point arithmetic addition/subtraction is executed in the mantissa addition/subtraction step, and data is passed without modification in the other steps.

However, the above mentioned four steps are executed sequentially, and the two barrel shiftings needing a substantial processing time are required. Therefore, the conventional floating point arithmetic addition/subtraction system has a long delayed time in its data processing. In addition, since the floating point arithmetic addition/subtraction system includes only one addition/subtraction circuit, an execution speed of the fixed point arithmetic addition/subtraction is low.

SUMMARY OF THE INVENTION

Accordingly, it is an object of the present invention to provide a floating point arithmetic operation system which has overcome the above mentioned defect of the conventional one.

Another object of the present invention is to provide a floating point arithmetic operation system capable of executing the data converting instruction with only addition of a slight amount of hardware.

Still another object of the present invention is to provide a floating point arithmetic operation system capable of executing an arithmetic operation with a reduced number of barrel shiftings.

A further object of the present invention is to provide a floating point arithmetic operation system capable of executing a fixed point arithmetic operation with an improved throughput.

The above and other objects of the present invention are achieved in accordance with the present invention by a method for converting integer data into floating point data, by using a floating point arithmetic addition/subtraction system which is configured to receive a pair of input operands of floating point data including its mantissa part expressed in an absolute value so as to execute an addition/subtraction and which includes at least a mantissa adder, a normalizing shifter, an exponent part updater and a bit position decoder, the method including the steps of supplying the integer data expressed in a 2's complement as one of the pair of input operands, converting the integer data into an absolute value by using the mantissa adder, adjusting the bit position of the obtained absolute value by using the normalizing shifter, and obtaining a value of the exponent part by using the updater and the bit position decoder.

According to another aspect of the present invention, there is provided a floating point arithmetic operation system comprising:

an expander receiving a first input operand and controlled to output the received first input operand without modification when floating point data including its mantissa part expressed in an absolute value is inputted as the first input operand so that the floating point arithmetic operation should be executed, the expander being also controlled to output a value obtained by expanding a sign bit of the first input operand when integer data expressed in 2's complement is inputted as the first input operand so that the integer data should be converted into floating point data;

a first selector receiving a second input operand and a value of all "1" bits and controlled to output the received second input operand without modification when another floating point data including its mantissa part expressed in an absolute value is inputted as the second input operand so that the floating point arithmetic operation should be executed, and to output the value of all "1" bits when the integer data should be converted into floating point data;

a comparator/selector having first and second inputs connected to outputs of the expander and the first selector, respectively, and configured to compare the first and second inputs so as to determine a large-and-small relation between the first and second inputs, the comparator/selector having first, second and third outputs and being controlled, when the floating point arithmetic operation should be executed, so as to output a mantissa part of a smaller one of the first and second inputs, a mantissa part of a larger one of the first and second inputs and an exponent part of the larger one from the first, second and third outputs, respectively, the comparator/selector being also controlled, when the integer data should be converted into floating point data, so as to output the expanded integer data and the value of all bits of "0" from the first and second outputs, respectively;

an exponent subtracter receiving an exponent part of the first and second input operands for outputting a difference in the exponent part of the first and second input operands;

a right shifter receiving the first output of the comparator/selector and the difference in the exponent part, the right shifter being controlled, when the floating point arithmetic operation should be executed, so as to shift the first output of the comparator/selector by an amount corresponding to the different in the exponent part for matching of the exponent part between the first and second input operands, the right shifter being also controlled, when the integer data should be converted into floating point data, so as to output the first output of the comparator/selector without modification;

an inverter receiving data outputted from the right shifter for outputting the received data without modification when addition is to be executed, the inverter outputting a 1's complement of the received data when subtraction is to be executed;

a mantissa adder having a first input receiving the second output of the comparator/selector and a second input receiving an output of the inverter, the mantissa adder outputting a sum of the first and second inputs when addition is to be executed, and also outputting a value obtained by adding "1" having a weight of the least significant bit to the sum of the first and second inputs when subtraction is to be executed;

a bit position decoder receiving an output of the mantissa adder for detecting a position of the most significant "1" bit in the output of the mantissa adder;

a normalizing shifter receiving the output of the mantissa adder and controlled by an output of the bit position decoder for shifting the output of the mantissa adder on the basis of the output of the bit position decoder for normalization of the output of the mantissa adder, an output of the normalizing shifter giving a mantissa part of the result of the addition/subtraction;

a second selector receiving the third output of the comparator/selector and a biased value for an exponent part, the second selector being controlled so as to output the third output of the comparator/selector when the floating point arithmetic operation should be executed, the second selector being also controlled so as to outputting the biased value when the integer data should be converted into floating point data; and an exponent part updater receiving an output of the second selector and controlled by the output of the bit position decoder for modifying the third output of the comparator/selector on the basis of the output of the bit position decoder, when the floating point arithmetic operation should be executed, so that an output of the exponent part updater gives a mantissa part of the result of the addition/subtraction, the exponent part updater being controlled by the output of the bit position decoder for modifying the biased value on the basis of the output of the bit position decoder, when the integer data should be converted into floating point data, so that an output of the exponent part updater gives an exponent part of floating point data converted from the integer data, whereby when integer data expressed in 2's complement is applied as the first input operand, floating point data converted from the integer data can be constituted from the sign bit of the integer data, the output of the exponent updater and the output of the normalizing shifter.

According to a third aspect of the present invention, there is provided a floating point arithmetic addition/subtraction method comprising the steps of:

receiving a pair of input operands of floating point data, executing a large-and-small comparison between the pair of input operands and calculating a difference in exponent between the pair of input operands;

when the difference in exponent is "1" or less and a required arithmetic addition/subtraction is a true subtraction, rightward shifting a mantissa part of a smaller one of the pair of input operands by the shifting amount of "0" or "1" for matching of exponent parts, performing a mantissa subtraction between a mantissa part of a larger one of the pair of input operands and the right-shifted mantissa part of the smaller input operand, and barrel-shifting a result of the mantissa subtraction for normalization; and when the difference in exponent is "2" or more or the required arithmetic addition/subtraction is a true addition, rightward barrel-shifting the mantissa part of the smaller input operand for matching of exponent parts, performing a mantissa subtraction between the mantissa part of the larger input operand and the barrel-shifted mantissa part of the smaller input operand, and shifting a result of the mantissa subtraction by the shifting amount of "0" or "1" for normalization.

According to a fourth aspect of the present invention, there is provided a floating point arithmetic operation system comprising:

a comparator/selector receiving first and second input operands of floating point data and configured to compare the first and second input operands so as to determine a large-and-small relation between the first and second input operands and to output a mantissa part of a smaller one of the first and second input operands, a mantissa part of a larger one of the first and second input operands and an exponent part of the larger input operand;

an exponent subtracter receiving an exponent part of the first and second input operands for outputting a difference of exponent parts between the first and second input operands;

a right barrel shifter receiving the mantissa part of the smaller input operand for rightward shifting the mantissa part of the smaller input operand by the amount corresponding to the difference of exponent part from the exponent subtracter for the purpose of the matching of exponent parts;

a first adder/subtracter receiving an output of the right barrel shifter and the mantissa part of the larger input operand;

a bidirectional shifter receiving an output of the first adder/subtracter for rightward or leftward shifting the output of the first adder/subtracter by the shifting amount of one bit or less required for normalization;

a right shifter receiving the mantissa part of the smaller input operand for rightward shifting the mantissa part of the smaller input operand by the shifting amount of one bit or less for the purpose of the matching of exponent parts;

a second adder/subtracter receiving an output of the right shifter and the mantissa part of the larger input operand;

a bit position decoder receiving an output of the second adder/subtracter for detecting a required amount of shifting for normalization;

a normalizing barrel shifter receiving the output of the second adder/subtracter for shifting the output of the second adder/subtracter by the required amount of shifting supplied from the bit position decoder;

a first selector receiving an output of the bidirectional shifter and an output of the normalizing barrel shifter for selecting and outputting the output of the normalizing barrel shifter when the difference in exponent is "1" or less and a required arithmetic addition/subtraction is a true subtraction and the output of the bidirectional shifter when the difference in exponent is "2" or more or the required arithmetic addition/subtraction is a true addition; and an exponent part updater receiving the exponent part of the larger input operand for updating the exponent part of the larger input operand in compliance with the amount of shifting for the normalization.

In a preferred embodiment, the floating point arithmetic addition/subtraction system further includes a second selector receiving the mantissa part of the smaller input operand from the comparator/selector and a first fixed point data for selectively outputting either the mantissa part of the smaller input operand or the first fixed point data to the right shifter, and a third selector receiving the mantissa part of the larger input operand from the comparator/selector and a second fixed point data for selectively outputting either the mantissa part of the larger input operand or the second fixed point data to the second adder/subtracter.

The above and other objects, features and advantages of the present invention will be apparent from the following description of preferred embodiments of the invention with reference to the accompanying drawings.

BRIEF DESCRIPTION OF THE DRAWINGS

FIGS. 4 and 5 illustrate examples of the normalization and the exponent part matching;

DESCRIPTION OF THE PREFERRED EMBODIMENTS

Figure 1A:
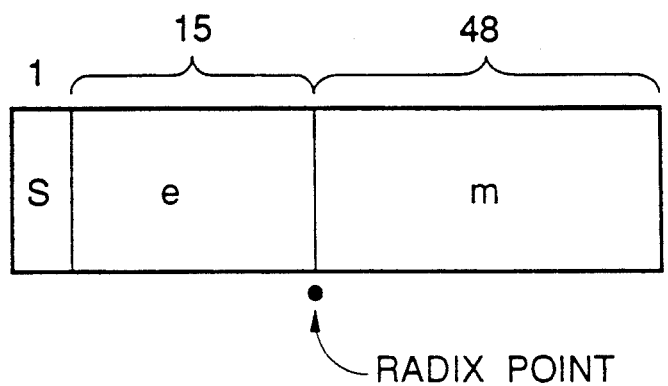
FIGS. 1A and 1B illustrate formats of floating point data and integer data, respectively.

Referring to FIG. 1A, there is shown an example of a floating point data format of 64 bits, which includes a sign part "S" composed of one bit (most significant bit), an exponent part "e" of 15 bits having a biased value of "16384", and a mantissa part "m" of 48 bits expressed in the form of a normalized absolute value. Therefore, this floating point data expresses the following value:

$$(-1)^S \times 2^{e-16384} \times m$$

Figure 1B:
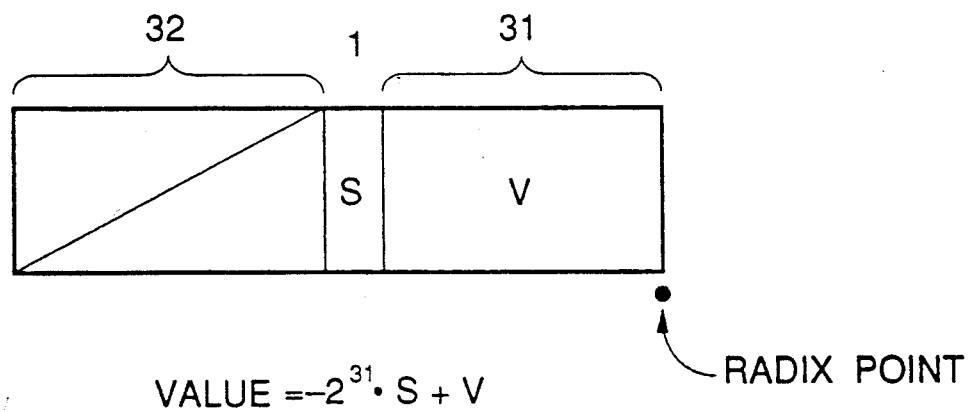

On the other hand, an integer data format expressed in a 2's complement is composed for example as shown in FIG. 1B. The shown integer data format is formally composed of 64 bits, but it is assumed that the least significant 32 bits expresses a binary number in a 2's complement having a sign bit "S", and the most significant 32 bits are indefinite.

Under the above assumption, a principle of the floating point arithmetic operation system in accordance with the first aspect of the present invention will be explained with reference to FIGS. 2A to 2D.

Figure 2A:
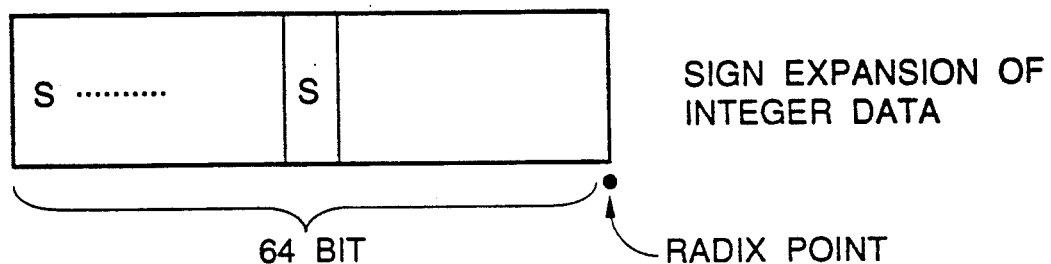
FIGS. 2A to 2D illustrate a principle of the present invention for converting the integer data into the floating point data.

First, the input integer data of 32 bits expressed in 2's complement as shown in FIG. 1B is expanded into an expression of 64 bits by expanding the sign bit "S", namely, putting the sign bit "S" into each digit of the most significant 32 bits of the 64 bits, as shown in FIG. 2A.

Figure 2B:
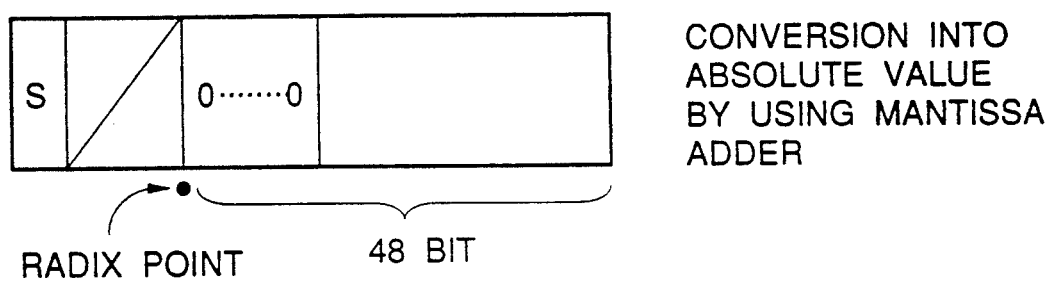

Then, as shown in FIG. 2B, the integer data is converted into an absolute value expression. If the integer data is a negative value, the integer data is converted into a 1's complement by using an inverter, and then, "1" having the weight of the least significant bit is added to the 1's complement by using a mantissa addition circuit.

Figure 2C:
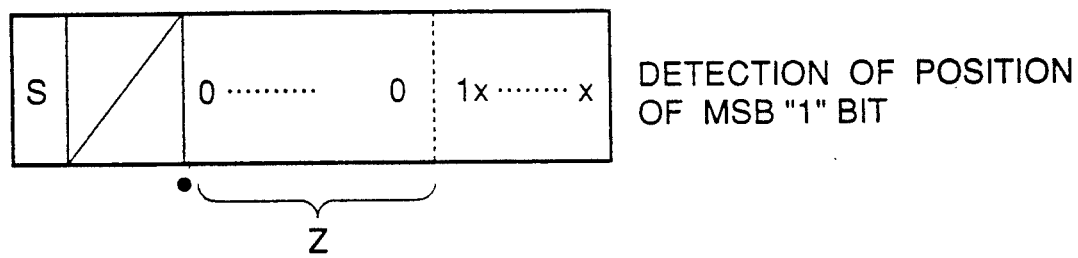

Thereafter, as shown in FIG. 2C, the number of bits from the radix point position determined in the floating point data format, to a digit just before the most significant "1" bit in the obtained absolute value data, is counted or detected by a bit position detector.

Figure 2D:
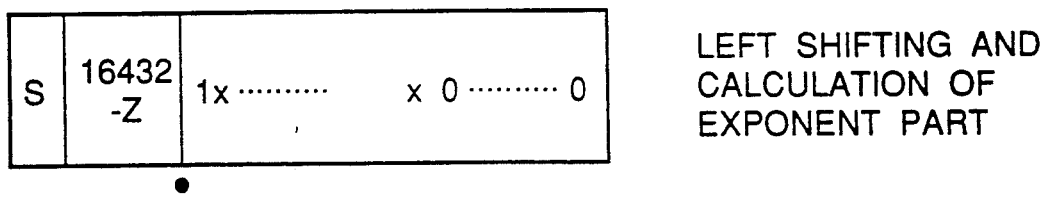

Furthermore, as shown in FIG. 2D, the shifting of the obtained absolute value is performed by the detected bit number "Z" so as to normalize the obtained absolute value. Thus, the calculation of the mantissa is completed.

On the other hand, the exponent part can be obtained by substracting the number "Z" of bits shifted for normalization, from "16432". This value of "16432" is a constant number obtained by adding the biased value "16384" of the exponent part with the bit length "48" of the mantissa part. Incidentally, the sign is the same regardless of whether the data is the integer data or the floating point data.

Figure 3:
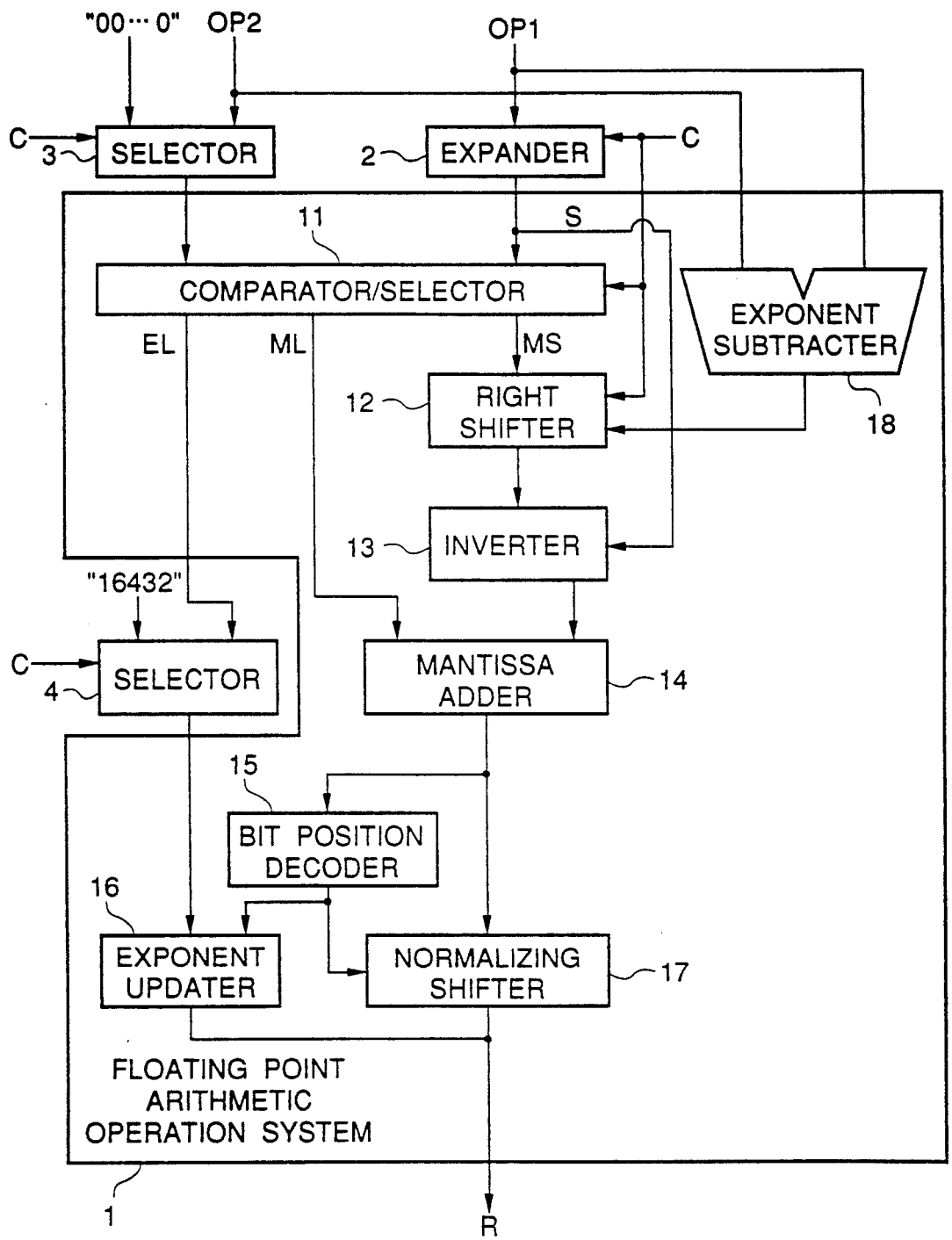
FIG. 3 is a block diagram of an embodiment of the floating point arithmetic operation system in accordance with the first aspect of the present invention.

Now, a first embodiment of the floating point arithmetic operation system in accordance with the present invention will be described with reference to FIG. 3.

The shown floating point arithmetic operation system includes a floating point arithmetic addition/subtraction circuit 1, an expander 2 located before one of a pair of inputs of the floating point arithmetic addition/subtraction circuit 1, and a selector 3 located before to the other input of the floating point arithmetic addition/subtraction circuit 1, and another selector 4 added into the floating point arithmetic addition/subtraction circuit 1.

The expander 2 connectedto receive a first input operand OP1 and controlled by a control signal "C" so as to output the received first input operand OP1 without modification when a floating point arithmetic operation is to be executed, and to output a value obtained by expanding a sign bit of the received first input operand OP1 when the received first input operand OP1 is integer data expressed in a 2's complement and should be converted into floating point data.

On the other hand, the selector 3 has a first input receiving a second input operand OP2 and a second input receiving a value which is "0" in all bits. This selector 3 is also controlled by the control signal "C" so as to output the received second operand OP2 when the floating point arithmetic operation is to be executed, and to output the value of all "0" bits when the integer data expressed in a 2's complement inputted as the first operand OP1 should be converted into floating point data.

The floating point arithmetic addition/subtraction circuit 1 includes a comparator/selector 11 having a first input connected to an output of the expander 2 so as to receive the first input operand OP1 and a second input connected to an output of the selector 3 so as to receive the second input operand OP2. When the floating point arithmetic operation is to be executed, the comparator/selector 11 is controlled by the control signal "C" so as to compare the first and second operands OP1 and OP2 in order to determine a large-and-small relation between the first and second operands OP1 and OP2. As the result of comparison, a mantissa part MS of a smaller one of the first and second operands OP1 and OP2 is supplied to a right shifter 12, and a mantissa part ML of a larger one of the first and second operands OP1 and OP2 is supplied to a mantissa adder 14. In addition, an exponent part EL of the larger one of the first and second operands OP1 and OP2 is supplied to one input of the second selector 4.

On the other hand, when the integer data expressed in a 2's complement inputted as the first operand OP1 should be converted into floating point data, the comparator/selector 11 is controlled by the control signal "C" so as to output the expanded integer data to the right shifter 12, and the value of all "0" bits to the mantissa adder 14.

The second selector 4 has its other input receiving a constant number "16432". This second selector 4 is controlled by the control signal "C" so as to output the exponent part EL from the comparator/selector 11 to an exponent updater 16 when the floating point arithmetic operation is to be executed. When the integer data expressed in a 2's complement inputted as the first operand OP1 should be converted into floating point data, the second selector 4 is controlled by the control signal "C" so as to output the constant number "16432" to the exponent updater 16.

The floating point arithmetic addition/subtraction circuit 1 also includes an exponent subtracter 18 receiving an exponent part of the first operand OP1 and an exponent part of the second operand OP2 for outputting a difference in the exponent between the first and second operands OP1 and OP2. This difference in the exponent is supplied to the right shifter 12, so that the right shifter 12 shifts rightward the mantissa part MS of a smaller one of the first and second operands OP1 and OP2 for a matching of the exponent part between the first and second operands OP1 and OP2.

An output of the right shifter 12 is connected to an inverter 13, which also receives the sign bit "S" from the output of the expander 2. This inverter 13 is configured to output the received data without modification when addition should be performed between the first and second operands OP1 and OP2, and to output a 1's complement of the received data when subtraction should be performed between the first and second operands OP1 and OP2. An output of the inverter 13 is connected to one input of a mantissa adder 14, which in turn has its other input connected to receive the mantissa part ML of the larger one of the first and second operands OP1 and OP2 from the comparator/selector 11.

This mantissa adder 14 is configured to output the sum of the two inputs when addition should be performed between the first and second operands OP1 and OP2. In addition, when subtraction should be performed between the first and second operands OP1 and OP2, the mantissa adder 14 outputs a value obtained by adding "1" having a weight of the least significant bit to the sum of the two inputs. An output of the mantissa adder 14 is connected to an input of a bit position decoder 15, which detects a position of the most significant "1" bit in the output of the mantissa adder 14.

An output of the bit position decoder 15 is connected to the exponent updater 16, which also receives through the selector 4 the exponent part EL of the larger one of the first and second operands OP1 and OP2 from the comparator/selector 11. The updater 16 modifies the received exponent part EL on the basis of the output of the bit position decoder 15. In addition, the output of the mantissa adder 14 is connected to an input of a normalizing shifter 17, which is configured to shift the output of the mantissa adder 14 on the basis of the output of the bit position decoder 15.

In the above mentioned arrangement, the floating point arithmetic addition/subtraction circuit 1 substantially corresponds to a conventional floating point arithmetic addition/subtraction system. Therefore, control signals for elements included in the floating point arithmetic addition/subtraction 1 are omitted for simplification of the drawing, and therefore, explanation thereof will be also omitted.

Now, operation of the first embodiment as mentioned above will be described. First, a floating point addition/subtraction operation will be explained.

In the case of the floating point addition/subtraction operation, the expander 2 and the selector 3 receive, as the two input operands OP1 and OP2, a pair of floating point data in the format as shown in FIG. 1A, respectively, and then, output the received data without modification to the comparator/selector 11.

The comparator/selector 11 compares the received two input operands OP1 and OP2, and outputs the mantissa part MS of a smaller one of the two input operands OP1 and OP2 to the right shifter 12. Under control of the exponent subtracter 18, the right shifter 12 shifts the received mantissa part MS rightward by the amount required for matching of the exponent part. The output of the right shifter 12 is coupled to the inverter 13.

When an instruction to be executed is addition, the inverter 13 outputs the received data without modification. However, when the instruction to be executed is subtraction, the inverter 13 outputs a 1's complement of the received data.

The mantissa adder 14 adds the output of the inverter 13 with the mantissa ML of the larger one of the two input operands OP1 and OP2 supplied from the comparator/selector 11. When the instruction to be executed is addition, the mantissa adder 14 outputs a sum of the two inputs. However, when the instruction to be executed is subtraction, the mantissa adder 14 outputs a value obtained by adding "1" having the weight of the least significant bit to the sum of the two inputs. Therefore, with cooperation with the inverter 13, the subtraction is performed by using a 2's complement.

The bit position decoder 15 scans the data outputted from the mantissa adder 14, and detects the bit position of the most significant "1" bit. Namely, the bit position decoder 15 detects the number of bits obtained by counting from the most significant bit position of the data up to the bit position of a "0" bit just before the most significant "1" bit.

The normalizing shifter 17 shifts the data outputted from the mantissa adder 14, by the number of bits detected by the bit position decoder 15, so that the most significant bit becomes "1". In this case, when the addition is executed, it becomes in some case necessary to shift rightward by one bit for compensating an overflow. On the other hand, when the subtraction is executed, a left barrel shifter becomes necessary.

In parallel to the above mentioned operation, the exponent part is updated by the updater 16. Namely, in the updater 16, the left shift amount executed by the normalizing shifter 17 is subtracted from the exponent part EL of the larger one of the input operands OP1 and OP2 supplied from the comparator/selector 11.

Thus, an output of the updater 16 and an output of the normalizing shifter 17 constitute data R indicative of the result of floating point addition/subtraction.

Next, operation for converting integer data into floating point data will be described.

In this case, the integer data as shown in FIG. 1B is inputted as the input operand OP1 to the expander 2, where the sign bit of the integer data is expanded as shown in FIG. 2A. On the other hand, the selector 3 outputs data which is "0" in all bits.

When the data conversion instruction is executed, the comparator/selector 11 is controlled by the control signal "C" so as to output the integer data to the right shifter 12 and also to output the data of all bits of "0" to the mantissa adder 14. The right shifter 12 is also controlled by the control signal "C" so as to output the received data without modification to the inverter 13.

The inverter 13 converts the integer data expressed in the 2's complement into an absolute value expression. For this purpose, the inverter 13 is controlled by the 32th bit of the integer data, namely, the sign bit "S" of the integer data, so that when the input data is negative, the inverter inverts each bit of the received data so as to output a 1's complement.

The mantissa adder 14 sums the data of all "0" bits from the comparator/selector 11 and the integer data or its 1's complement data from the inverter 13. In addition, if the input integer data is negative, the mantissa adder 14 also adds "1" having the weight of the least significant bit to the sum of the two inputs.

Thus, the 2's complement expression is converted into the absolute value.

Regardless of whether the instruction is the floating point addition/subtraction or the data conversion, the bit position decoder 15 detects the position of the most significant "1" of the received data, and the normalizing shifter 17 shifts the received data so that the most significant bit of the output data becomes "1".

The selector 4 outputs the value of "16432" to the updater 16. The updater 16 outputs a value obtained by subtracting from the value of "16432" the output of the bit position decoder 15, namely, the number of bits ("Z" in FIG. 2C) obtained by counting from the most significant bit position of the output of the mantissa adder 15 to the position of a "0" bit just before the most significant "1" bit of the same output. This data constitutes an exponent part of the floating point data converted from the integer data. Of course, the sign bit of the integer data constitutes the sign bit of the obtained floating point data.

As seen from the above description with reference to the accompanying drawings, the first embodiment of the floating point arithmetic operation system can be realized by adding only one expander and two selectors to the conventional floating point arithmetic addition/subtraction system which is configured to receive a pair of input operands of floating point data including its mantissa part expressed in an absolute value so as to execute an addition/subtraction and which includes at least a mantissa adder, a normalizing shifter, an exponent part updater and a bit position decoder. The first embodiment thus constructed can execute the data conversion instruction for converting the integer data into the floating point data, which is effective in fastening the computer system, by supplying the integer data expressed in a 2's complement as one of the pair of input operands, converting the integer data into an absolute value by using the mantissa adder, adjusting the bit position of the obtained absolute value by using the normalizing shifter, and obtaining a value of the exponent part by using the updater and the bit position decoder.

Now, a principle of the floating point arithmetic operation system in accordance with another aspect of the present invention will be described. First, consider the normalizing processing in the floating point arithmetic operation. In a conclusion, only in the following two cases, there is possibility that the shifting of two or more bits of the mantissa part becomes necessary for normalization. In the other cases, the amount of shifting for normalization is one bit at most.

(1) If a processing to be executed is a "true subtraction" and if a pair of given operands have their exponent part of the same value, there is possibility that a left shifting of two or more bits of the mantissa part becomes necessary for normalizing the result of subtraction of the mantissa parts. One example of this calculation is shown in FIG. 4.

Here, the "true subtraction" and a "true addition" are defined as follows: Even if the kind of the operation instruction is "add", there is a case in which the subtraction has to be actually executed, dependently upon a relation between signs "Xs" and "Ys" of input operands. If numbers are expressed in decimal notation for convenience, for example, addition of $(+5)$ and $(-6)$ is $(+5) + (-6)$, and therefore, $5-6$. Namely, this addition is really subtraction. On the other hand, subtraction of $(-6)$ from $(+5)$ is $(+5) - (-6)$, and therefore, $5+6$. Namely, this subtraction is really addition. The former of these two examples is called the "true subtraction" and the latter is called the "true addition". These "true subtraction" and "true addition" are distinguished from kinds of simple instructions "add" and "subtract".

(2) If a processing to be executed is the "true subtraction" and if a difference between exponent parts of a pair of given operands is "1", there is possibility that the left shifting of two or more bits of the mantissa part becomes necessary for normalizing the result of subtraction of the mantissa parts. One example of this calculation is shown in FIG. 5.

In cases other than the above mentioned two cases, the amount of shifting for normalizing the mantissa part of the result of addition/subtraction is one ("1") or zero ("0"). The reason for this is as follows: In the case of the "true addition", the result of addition of the mantissa parts is either that a position of $2^1$ becomes "1" because of a carrying-up from a position of $2^0$ (the result of addition becomes "1x.xxxx·····") or that no carrying-up occurs from a position of $2^0$ (the result of addition becomes "1.xxxx·····"). Therefore, a right shifting of only one bit for normalization becomes necessary only when a carrying-up occurs. In the case of the "true subtraction" and if the difference between exponent parts of a pair of given operands is "2" or more, the subtraction of the mantissa part becomes $(1.xxxx·····)-(0.0\cdot\cdot 01xxx·····)$, and therefore, the solution becomes "1.xxxx·····" or "0.1xxx·····". Therefore, only the left shifting of one bit or less is required for normalization.

It will be noted from the above explanation that the floating point arithmetic addition/subtraction can be divided into the following two types of processing procedure:

Processing procedure A: In this processing procedure, there is possibility that the left barrel shifting of two bits or more in the mantissa part is performed for normalization. This occurs in the case in which the operation is the "true subtraction" and the difference between exponent parts of the given operands is "0" or "1". In this case, the exponent part matching executed before the subtraction of the mantissa parts is the shifting of only one bit at most.

Processing procedure B: In this processing procedure, the shifting of the mantissa part for normalization is the right or left shifting of one bit or less. This occurs in the case of the "true addition" or in the case in which the operation is the "true subtraction" and the difference between exponent parts of the given operands is "2" or more.

Figure 6:
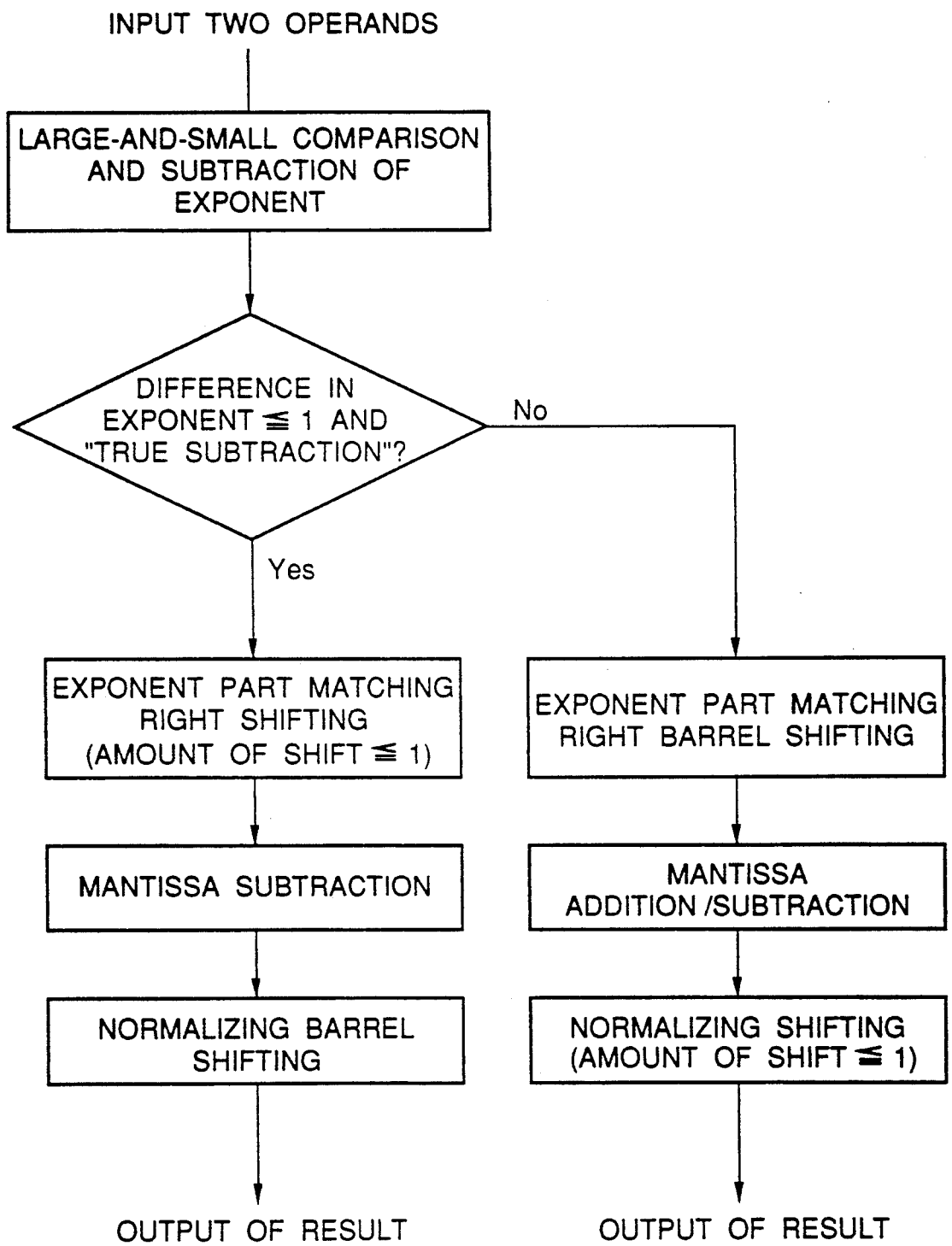
FIG. 6 is a flow chart illustrating a principle of the floating point arithmetic operation system in accordance with the present invention.

Thus, in the floating point arithmetic addition/subtraction in accordance with the second aspect of the present invention, the processing to be executed after the large-and-small comparison and the subtraction of exponent is divided into two different flows of processing as shown in FIG. 6, which is a flow chart illustrating a principle of the floating point arithmetic operation system in accordance with the second aspect of the present invention.

Namely, in the case that the processing is the "true subtraction" and the difference of exponent is "0" or "1", the right shifting of one bit or less is performed for the matching of the exponent parts, and then, the mantissa subtraction is performed, and finally, the normalizing barrel shifting is executed (this corresponds to the processing procedure A). In the case that the processing is the "true addition" or the operation is the "true subtraction" and the difference of exponent parts between the given operands is "2" or more, the right barrel shifting is performed for the matching of the exponent parts, and then, the mantissa addition/subtraction is performed, and finally, the normalizing shifting of one bit or less is executed (this corresponds to the processing procedure B).

As seen from the above, the right shifting for the matching of the exponent parts in the processing procedure A and the normalizing shifting in the processing procedure B requires only a short processing time since the amount of these shiftings is "1" or less. Accordingly, the processing time of the processing procedures A and B is substantially determined by a time required for the mantissa addition/subtraction and only one barrel shifting. In other words, since it is unnecessary to sequentially execute the two barrel shiftings as in the conventional floating point arithmetic addition/subtraction system, a high speed floating point arithmetic addition/subtraction can be realized.

Figure 7:
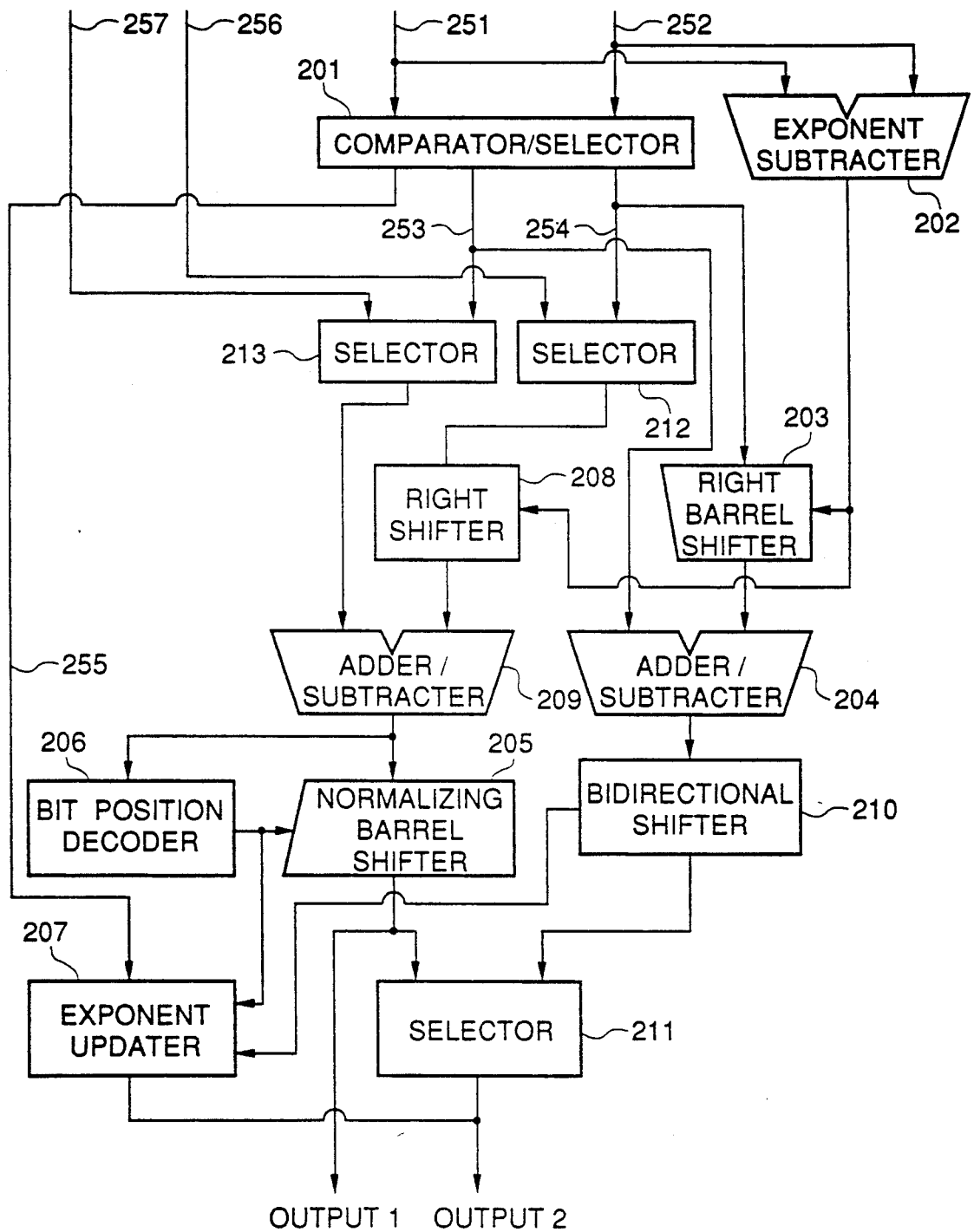
FIG. 7 is a block diagram of an embodiment of the floating point arithmetic operation system in accordance with the second aspect of the present invention.

Referring to FIG. 7, there is shown a block diagram of an embodiment of the floating point arithmetic addition/subtraction system in accordance with the second aspect of the present invention.

The shown second embodiment of the floating point arithmetic addition/subtraction system includes a comparator/selector 201 and an exponent subtracter 202 each of which receives a pair of input operands 251 and 252 of floating point data. The exponent subtracter 202 calculates the difference in exponent parts of the input operands 251 and 252. The comparator/selector 201 determines a large-and-small relation between the input operands 251 and 252, and outputs a mantissa part 253 of a larger one of the input operands 251 and 252 to a selector 213 and an adder/subtracter 204. In addition, the comparator/selector 201 outputs a mantissa part 254 of a smaller one of the input operands 251 and 252 to a selector 212 and a right barrel shifter 203. Furthermore, the comparator/selector 201 outputs an exponent part 255 of the larger input operand.

The selectors 212 and 213 receive first and second fixed point data at their other input, respectively.

In the case that a floating point arithmetic operation is to be executed, the selector 212 selects the mantissa part 254 of the smaller input operand, and the selector 213 selects the mantissa part 253 of the larger input operand.

In the following, the construction and the operation of the shown embodiment will be described by dividing those into the case that the processing is the "true subtraction" and the difference of exponent is "0" or "1" (processing procedure A) and the other cases (processing procedure B).

First, the construction and the operation in connection with the processing procedure A will be described. If the difference of exponent calculated in the exponent subtracter 202 is "1", a right shifter 208 receiving an output of the selector 212 (namely, the mantissa part 254 of the smaller input operand) is controlled by an output of the exponent subtracter 202 so as to shift the mantissa part 254 of the smaller input operand rightward by one bit for the purpose of matching the exponent parts. If the difference of exponent is "0", the right shifter 208 is controlled by the output of the exponent subtractor 202 so as to output the mantissa part 254 of the smaller input operand without modification.

An output of the right shifter 208 is connected to one input of an adder/subtracter 209, which has its other input connected to receive an output of the selector 213, namely, the mantissa part 253 of the larger input operand in this situation. Therefore, the adder/subtracter 209 outputs a difference between the output of the right shifter 208 and the mantissa part 253 of the larger input operand.

An output the adder/subtracter 209 is connected to a normalizing barrel shifter 205 and a bit position decoder 206. This bit position decoder 206 detects a position of the most significant "1" bit in the output of the adder/subtracter 209, and the normalizing barrel shifter 205 shifts the output of the adder/subtracter 209 on the basis of an output of the bit position decoder 206, so that the output of the adder/subtracter 209 is normalized. An output of the normalizing barrel shifter 205 is connected to a selector 211. This selector 211 is controlled to output the output of the normalizing barrel shifter 205 in the case that the processing is the "true subtraction" and the difference of exponent is "0" or "1" (processing procedure A)

In addition, an exponent updater 207 receives the exponent part 255 of the larger input operand from the comparator/selector 201, and the output of the bit position decoder 206, so as to modify the received exponent part 255 on the basis of the output of the bit position decoder 206.

Next, the construction and the operation in connection with the processing procedure B will be described.

The right barrel shifter 203 rightward barrel-shifts the mantissa part 254 of the smaller input operand by the amount corresponding the difference of exponent calculated in the exponent subtracter 202 for the purpose of matching the exponent parts. An output of the right barrel shifter 203 is connected to one input of an adder/subtracter 204, which has its other input connected to receive the mantissa part 253 of the larger input operand. The adder/subtracter 204 performs an addition or a subtraction between the output of the right barrel shifter 203 and the mantissa part 253 of the larger input operand.

As mentioned hereinbefore, the necessary and sufficient normalizing shift in the processing procedure B is the right or left shifting of one bit or less. Namely, if a carrying-up to the position of $2^1$ occurs in the "true addition" so that the output of the adder/subtracter 204 becomes "1x.xxx ·····", the right shifting of one bit is performed for normalization. On the other hand, if a borrowing-down from the position of $2^0$ occurs in the "true subtraction" so that the output of the adder/subtracter 204 becomes "0.1xxx ·····", the left shifting of one bit is performed for normalization. For this purpose, the output of the adder/subtracter 204 is connected to a bidirectional shifter 210, which has an output connected to the selector 211. This selector 211 is controlled to output the output of the bidirectional shifter 210 in the case that the processing is the "true addition" or the difference of exponent is "2" or more (processing procedure B).

In addition, the exponent updater 207 receiving the exponent part 255 of the larger input operand from the comparator/selector 201, also receives the amount and the direction of shifting performed for normalization from the bidirectional shifter 210, and modifies the received exponent part on the basis of the amount and the direction of shifting performed for normalization.

Now, the fixed point addition/subtraction will be described. This fixed point addition/subtraction can be performed by using either the adder/subtracter 204 or the adder/subtracter 209.

In the case of the fixed point addition/subtraction using the adder/subtracter 209, the first fixed point data 256 is selected by the selector 212 and supplied to the right shifter 208, and the second fixed point data 257 is selected by the selector 213 and supplied to the adder/subtracter 209. In this case, the right shifter 208 outputs the received first fixed point data 256 without modification to the adder/subtracter 209. Thus, the adder/subtracter 209 receives the first fixed point data 256 and the second fixed point data 257 and performs the fixed point addition/subtraction. The output of the adder/subtracter 209 is caused to pass through the normalizing barrel shifter 205 without modification, as OUTPUT 1.

In the case of the fixed point addition/subtraction using the adder/subtracter 204, a pair of fixed point data are supplied as the input operands 251 and 252, and are inputted through the comparator/selector 201 and the right barrel shifter 203 without modification to the adder/subtracter 204. Therefore, the adder/subtracter 209 receives the input operands 251 and 252 which are the pair of fixed point data, and performs the fixed point addition/subtraction. The output of the adder/subtracter 204 is caused to pass through the bidirectional shifter 210 without modification to the selector 211, and the selector 211 is controlled to select and output the output of the bidirectional shifter 210, as OUTPUT 2.

As seen from the above, the shown second embodiment includes two adder/subtracters 204 and 209 for the mantissa addition/subtraction. Therefore, at the time of executing the fixed point addition/subtraction, it is possible to cause the two adder/subtracters 204 and 209 to operate in parallel, and therefore, the throughput as fast as twice that of the conventional floating point arithmetic operation system can be realized in the fixed point addition/subtraction.

As seen from the above description with reference to the drawings, the floating point arithmetic addition/subtraction in accordance with the second aspect of the present invention is characterized in that, after the large-and-small comparison and the subtraction of exponent, and dependently upon the difference in exponent between the two given operands and upon whether the operation is the "true addition" or the "true subtraction", there is selectively performed either the processing procedure A in which the right shifting of one bit or less is performed for the matching of the exponent parts, and then, the mantissa subtraction is performed, and finally, the normalizing barrel shifting is executed, or the processing procedure B in which the right barrel shifting is performed for the matching of the exponent parts, and then, the mantissa addition/subtraction is performed, and finally, the normalizing shifting of one bit or less is executed. Since each of the processing procedures A and B includes the barrel-shifting of the number less than that in the conventional floating point arithmetic operation system by one, the processing time can be reduced. In addition, if the floating point arithmetic addition/subtraction in accordance with the second aspect of the present invention is used for the fixed point addition/subtraction, since the two mantissa adder/subtracters for separately processing the processing procedures A and B can be operated in parallel, the processing capacity twice that of the conventional floating point arithmetic operation system can be realized.

The invention has thus been shown and described with reference to the specific embodiments. However, it should be noted that the present invention is in no way limited to the details of the illustrated structures but changes and modifications may be made within the scope of the appended claims.

I claim:

1. A floating point arithmetic operation system to perform addition or subtraction, comprising:

an expander receiving a first input operand and controlled to output the received first operand without modification when floating point data including its mantissa part expressed in an absolute value is inputted as said first input operand so that a floating point arithmetic operation should be executed, said expander being also controlled to output a value obtained by expanding a sign bit of said first input operand when integer data expressed in 2's complement is inputted as said first input operand so that the integer data should be converted into floating point data;

a first selector receiving a second input operand and a value of all "0" bits and controlled to output the received second input operand without modification when another floating point data including its mantissa part expressed in an absolute value is inputted as said second input operand so that the floating point arithmetic operation should be executed, and to output said value of all "0" bits when the integer data should be converted into floating point data;

a comparator/selector having first and second inputs connected to outputs of said expander and said first selector, respectively, and configured to compare said first and second inputs so as to determine a large-and-small relation between said first and second inputs, said comparator/selector having first, second and third outputs and being controlled, when the floating point arithmetic operation should be executed, so as to output a mantissa part of a smaller one of said first and second inputs, a mantissa part of a larger one of said first and second inputs and an exponent part of said larger one to said first, second and third outputs, respectively, said comparator/selector being also controlled, when the integer data should be converted into floating point data, so as to output the expanded integer data and said value of all bits of "0" to said first and second outputs, respectively;

an exponent subtracter receiving an exponent part of said first and second input operands for outputting a difference in the exponent part of said first and second input operands;

a right shifter receiving said first output of said comparator/selector and said difference in the exponent part, said right shifter being controlled, when the floating point arithmetic operation should be executed, so as to shift said first output of said comparator/selector by an amount corresponding to said difference in the exponent part for matching of the exponent part between said first and second input operands, said right shifter being also controlled, when the integer data should be converted into floating point data, so as to output said first output of said comparator/selector without modification;

an inverter receiving data outputted from said right shifter for outputting the received data without modification when addition of said first and said second input operands is to be executed, said inverter outputting a 1's complement of the received data when subtraction of said first and said second input operands is to be executed;

a mantissa adder having a first input receiving said second output of said comparator/selector and a second input receiving an output of said inverter, said mantissa adder outputting a sum of said first and second input operands when addition of said first and said second input operands is to be executed, and also outputting a value obtained by adding "1" having a weight of the least significant bit to said sum of said first and second input operands when subtraction of said first and said second input operands is to be executed;

a bit position decoder receiving said output of said mantissa adder, said bit position decoder detecting and outputting a position of the most significant "1" bit in the output of said mantissa adder;

a normalizing shifter receiving said output of said mantissa adder and controlled by said output of said bit position decoder for shifting said output of said mantissa adder on the basis of said output of said bit position decoder for normalization of said output of said mantissa adder, an output of said normalizing shifter giving a mantissa part of the result of the addition/subtraction;

a second selector receiving said third output of said comparator/selector and a biased value for an exponent part, said second selector being controlled so as to output said third output of said comparator/selector when the floating point arithmetic operation should be executed, said second selector being also controlled so as to output said biased value when the integer data should be converted into floating point data; and an exponent part updater receiving an output of said second selector and controlled by said output of said bit position decoder for modifying said third output of said comparator/selector on the basis of said output of bit position decoder, when the floating point arithmetic operation should be executed, so that an output of said exponent part updater gives a mantissa part of the result of the addition/subtraction, said exponent part updater being controlled by said output of said bit position decoder for modifying said biased value on the basis of said output of said bit position decoder, when the integer data should be converted into floating point data, so that an output of said exponent part updater gives an exponent part of floating point data converted from the integer data, whereby when integer data expressed in 2's complement is applied as said first input operand, floating point data converted from said integer data can be constituted from said sign bit of said integer data, said output of said exponent updater and said output of said normalizing shifter.

2. A floating point arithmetic operation system comprising:

a comparator/selector receiving first and second input operands of floating point data and configured to compare said first and second input operands so as to determine a large-and-small relation between said first and second input operands and to output a mantissa part of a smaller one of said first and second input operands, a mantissa part of a larger one of said first and second input operands and an exponent part of said larger input operand;

an exponent subtracter receiving an exponent part of said first and second input operands for outputting a difference of exponent parts between said first and second input operands;

a right barrel shifter receiving said mantissa part of said smaller input operand for rightward shifting said mantissa part of said smaller input operand by the amount corresponding to said difference of exponent part from said exponent substracter for the purpose of the matching of exponent parts;

a first adder/subtracter receiving an output of said right barrel shifter and said mantissa part of said larger input operand;

a bidirectional shifter receiving an output of said first adder/subtracter for rightward or leftward shifting said output of said first adder/subtracter, said rightward or leftward shifting being in the amount of one bit or less as required for normalization of said output of said first adder/subtracter;

a right shifter receiving said mantissa part of said smaller input operand for rightward shifting said mantissa part of said smaller input operand by the shifting amount of one or less for the purpose of the matching of exponent parts;

a second adder/subtracter receiving an output of said right shifter and said mantisa part of said larger input operand;

a bit position decoder receiving an output of said adder/subtracter for detecting a required amount of shifting for normalization;

a normalizing barrel shifter receiving said output of said second adder/subtracter for shifting said output of said second adder/subtracter by said required amount of shifting supplied from said bit position decoder;

a first selector receiving an output of said bidirectional shifter and an output of said normalizing barrel shifter for selecting and outputting said output of said normalizing barrel shifter when said difference in exponent is "1" or less and a required arithmetic addition/subtraction is a true subtraction and said output of said bidirectional shifter when said difference in exponent is "2" or more or the required arithmetic addition/subtraction is a true addition; and an exponent part updater receiving said exponent part of said larger input operand for updating said exponent part of said larger input operand in compliance with the amount of shifting for said normalization.

3. A floating point arithmetic addition/subtraction system claimed in claim 2 further including a second selector receiving said mantissa part of said smaller input operand from said comparator/selector and a first fixed point data for selectively outputting either said mantissa part of said smaller input operand or said first fixed point data to said right shifter, and a third selector receiving said mantissa part of said larger input operand from said comparator/selector and a second fixed point data for selectively outputting either said mantissa part of said larger input operand or said second fixed point data to said second adder/subtracter.

* * * * *